US009253878B2

(12) United States Patent
Kobayashi et al.

(10) Patent No.: US 9,253,878 B2
(45) Date of Patent: Feb. 2, 2016

(54) CONDUCTIVE COMPOSITION AND CONDUCTIVE FILM (71) Applicant: TOKAI RUBBER INDUSTRIES, LTD., Aichi-ken (JP)

(72) Inventors: Jun Kobayashi, Aichi-ken (JP); Hitoshi Yoshikawa, Aichi-ken (JP)

(73) Assignee: SUMITOMO RIKO COMPANY LIMITED, Aichi (JP)

( * ) Notice: Subject to any disclaimer, the term of this patent is extended or adjusted under 35 U.S.C. 154(b) by 16 days.

(21) Appl. No.: 14/226,130

(22) Filed: Mar. 26, 2014

(65) Prior Publication Data

US 2014/0202745 A1 Jul. 24, 2014

Related U.S. Application Data (63) Continuation of application No. PCT/JP2013/056986, filed on Mar. 13, 2013.

(30) Foreign Application Priority Data

Mar. 29, 2012 (JP) .................................. 2012-077477

(51) Int. Cl.
*H05K 1/00* (2006.01)
*H05K 1/02* (2006.01)
(Continued)

(52) U.S. Cl.
CPC *H05K 1/028* (2013.01); *C08K 3/04* (2013.01); *C08K 7/06* (2013.01); *C08L 21/00* (2013.01); (Continued)

(58) Field of Classification Search
CPC ............ H01B 1/04; H01B 1/12; C08L 29/04; D02G 3/00
USPC ........... 174/254; 252/500, 502; 310/309, 363, 310/365, 800; 428/317.3, 913
See application file for complete search history.

(56) References Cited

U.S. PATENT DOCUMENTS 6,046,119 A * 4/2000 Kaibe et al. ...................... 442/76
6,376,971 B1 * 4/2002 Pelrine et al. ................. 310/363
(Continued)

FOREIGN PATENT DOCUMENTS

CN 101146937 A 3/2008
CN 102227782 A 10/2011
(Continued)

OTHER PUBLICATIONS

English Translation of International Preliminary Report on Patentability of International Application No. PCT/JP2013/056986, which was issued Oct. 1, 2014.
(Continued)

*Primary Examiner* — Xiaoliang Chen
(74) *Attorney, Agent, or Firm* — Greenblum & Bernstein, P.L.C.

(57) ABSTRACT

Provided is a conductive composition that has a high conductivity and from which a coating can be formed easily. Also provided is a conductive film that has a high conductivity and in which electric resistance is less likely to increase even during expansion. A conductive composition is prepared by including an elastomer component, a fibrous carbon material having a graphite structure and a fiber diameter of not less than 30 nm, and a conductive carbon black having a structure. A conductive film formed from the conductive composition. The viscosity of the conductive composition formed into a coating with a solid content concentration of not less than 20% by mass, which is measured with a B-type viscometer with an H7 rotor under the conditions of a temperature of 25° C. and a rotation speed of 20 rpm, is not more than 200 Pa·s.

19 Claims, 4 Drawing Sheets

(51) Int. Cl.

| | |
|---|---|
| C09D 11/02 | (2014.01) |
| C08K 3/04 | (2006.01) |
| C08K 7/06 | (2006.01) |
| C08L 21/00 | (2006.01) |
| H01B 1/24 | (2006.01) |
| H05K 1/09 | (2006.01) |
| H05K 1/11 | (2006.01) |
| H05K 9/00 | (2006.01) |

(52) U.S. Cl.
CPC *C09D 11/02* (2013.01); *H01B 1/24* (2013.01); *H05K 1/095* (2013.01); *H05K 1/11* (2013.01); *H05K 9/0083* (2013.01); *C08K 2201/001* (2013.01); *H05K 1/0283* (2013.01); *H05K 2201/026* (2013.01); *H05K 2201/0281* (2013.01); *H05K 2201/0314* (2013.01); *H05K 2201/0323* (2013.01); *Y10T 428/31663* (2015.04); *Y10T 428/31935* (2015.04)

(56) References Cited

U.S. PATENT DOCUMENTS

| | | | | |
|---|---|---|---|---|
| 6,543,110 | B1* | 4/2003 | Pelrine et al. | 29/25.35 |
| 6,545,384 | B1* | 4/2003 | Pelrine et al. | 310/309 |
| 6,781,284 | B1* | 8/2004 | Pelrine et al. | 310/330 |
| 6,812,624 | B1* | 11/2004 | Pei et al. | 310/309 |
| 7,034,432 | B1* | 4/2006 | Pelrine et al. | 310/309 |
| 8,446,075 | B2 | 5/2013 | Takahashi et al. | |
| 2002/0142163 | A1 | 10/2002 | Mino et al. | |
| 2006/0113878 | A1* | 6/2006 | Pei et al. | 310/363 |
| 2009/0142581 | A1 | 6/2009 | Heintz et al. | |
| 2010/0301278 | A1* | 12/2010 | Hirai et al. | 252/502 |
| 2012/0022217 | A1* | 1/2012 | Beniya et al. | 525/194 |
| 2012/0114930 | A1* | 5/2012 | Yamamoto et al. | 428/317.3 |
| 2012/0157593 | A1* | 6/2012 | Ootake et al. | 524/272 |
| 2012/0169184 | A1* | 7/2012 | Pelrine et al. | 310/365 |
| 2014/0090884 | A1 | 4/2014 | Kobayashi et al. | |

FOREIGN PATENT DOCUMENTS

| | | |
|---|---|---|
| EP | 1 981 035 | 10/2008 |
| JP | 2003-168606 | 6/2003 |
| JP | 2006-045383 | 2/2006 |
| JP | 2006-140142 | 6/2006 |
| JP | 2008-186590 | 8/2008 |
| JP | 2008-198425 | 8/2008 |
| JP | 2009-227985 | 10/2009 |
| JP | 2010-260985 | 11/2010 |
| JP | 2010-275460 | 12/2010 |
| WO | 2006/100877 A1 | 9/2006 |
| WO | 2010/038784 A1 | 4/2010 |

OTHER PUBLICATIONS

U.S. Appl. No. 14/225,910, filed Mar. 26, 2014.
International Search Report for PCT/JP2013/056986, which was mailed on May 21, 2013.
Korean Office Action issued with respect to application No. 10-2014-7012638, mail date is Jul. 8, 2015.
Joe Hodkiewicz, "Rapid quality screening of carbon nanotubes with Raman spectroscopy", Thermo Fisher Scientific, Application Note: 51847, 2010.
Japanese Office Action for Application No. 2014-507644, which is dated Feb. 17, 2015, along with an English language translation.
Chinese Office Action issued with respect to application No. 201380003986.1, mail date is Aug. 11, 2015.
European Search report issued with respect to application No. 13767869.4, mail date is Oct. 9, 2015.

* cited by examiner

VOLTAGE OFF (b)

VOLTAGE ON

FIG. 4

CONDUCTIVE COMPOSITION AND CONDUCTIVE FILM

CLAIM FOR PRIORITY

This application is a Continuation of PCT/JP2013/056986 filed Mar. 13, 2013, and claims the priority benefit of Japanese application 2012-077477, filed Mar. 29, 2012, the contents of which is expressly incorporated by reference herein in its entirety.

TECHNICAL FIELD

The present invention relates to a conductive film suitable for, for example, electrodes and wires for flexible transducers including a polymer material, electromagnetic shields, and flexible wiring boards, and a conductive composition for forming the same.

BACKGROUND ART

Transducers are known, such as actuators and sensors that perform conversion between mechanical energy and electric energy, or speakers and microphones that perform conversion between acoustic energy and electric energy. To form highly flexible, compact, and lightweight transducers, polymer materials such as dielectric elastomers are useful. For example, an actuator can be formed with a pair of electrodes arranged on both front and back surfaces of a dielectric layer of a dielectric elastomer. A capacitance-type sensor can also be formed with electrodes with a dielectric layer interposed therebetween.

In the actuators and sensors of this type, it is desirable that the electrodes are expandable and contractible in accordance with deformation of the dielectric layer. To form flexible electrodes, conductive materials have been developed that are formed by blending conductive carbon black or metal powder in a binder such as an elastomer. For example, Patent Document 1 discloses an electrode obtained by blending particular carbon nanotubes having a three dimensional shape and carbon black in an elastomer. Patent Document 2 discloses an electrode obtained by blending carbon nanotubes in a base rubber.

RELATED ART DOCUMENTS

Patent Documents

Patent Document 1: Japanese Patent Application Publication No. 2008-198425 (JP 2008-198425 A)
Patent Document 2: Japanese Patent Application Publication No. 2009-227985 (JP 2009-227985 A)

SUMMARY OF THE INVENTION

Problem to be Solved by the Invention

The conductivity of the conventional electrodes, however, is not considered to be sufficient. In particular, an increase in electric resistance during expansion is large. A thin film-like electrode is usually formed from a conductive coating in which a conductive material is dispersed in a polymer solution containing an elastomer component dissolved therein. For example, when conductive carbon black having a structure is used as a conductive material, a wet disperser, a jet mill, an ultrasonic disperser, or the like using media such as glass beads is required to be used in order to uniformly disperse the conductive carbon black into the polymer solution. When such a device is used, however, primary particles are broken to decrease the crystallinity, or the aspect ratio becomes smaller. This results in reduction in conductivity of the electrodes formed.

Carbon nanotubes having various structures with different diameters are known. For example, large-diameter carbon nanotubes having a diameter of about 150 nm can be easily dispersed in a polymer solution using, for example, a triple-roll mill. In the case where large-diameter carbon nanotubes are used, the viscosity is less likely to increase when a conductive coating is prepared. However, when large-diameter carbon nanotubes alone are blended in an elastomer, the number of contact points between carbon nanotubes is small. For this reason, entanglement of the carbon nanotubes with each other cannot be maintained during expansion, so that the electric resistance increases. In contrast, in the case where small-diameter carbon nanotubes having a diameter of less than 30 nm are used, the viscosity increase during dispersion in a polymer solution is large in accordance with the increased surface area. It is therefore difficult to prepare a conductive coating when small-diameter carbon nanotubes are used.

The present invention was made in view of the foregoing situation and aims to provide a conductive composition that has a high conductivity and from which a coating can be formed easily. The present invention also aims to provide a conductive film that has a high conductivity and in which electric resistance is less likely to increase even during expansion.

Means for Solving the Problem (1) To solve the aforementioned problem, a conductive composition according to the present invention is characterized by comprising an elastomer component, a fibrous carbon material having a graphite structure and a fiber diameter of not less than 30 nm, and a conductive carbon black having a structure.

Figure 1:
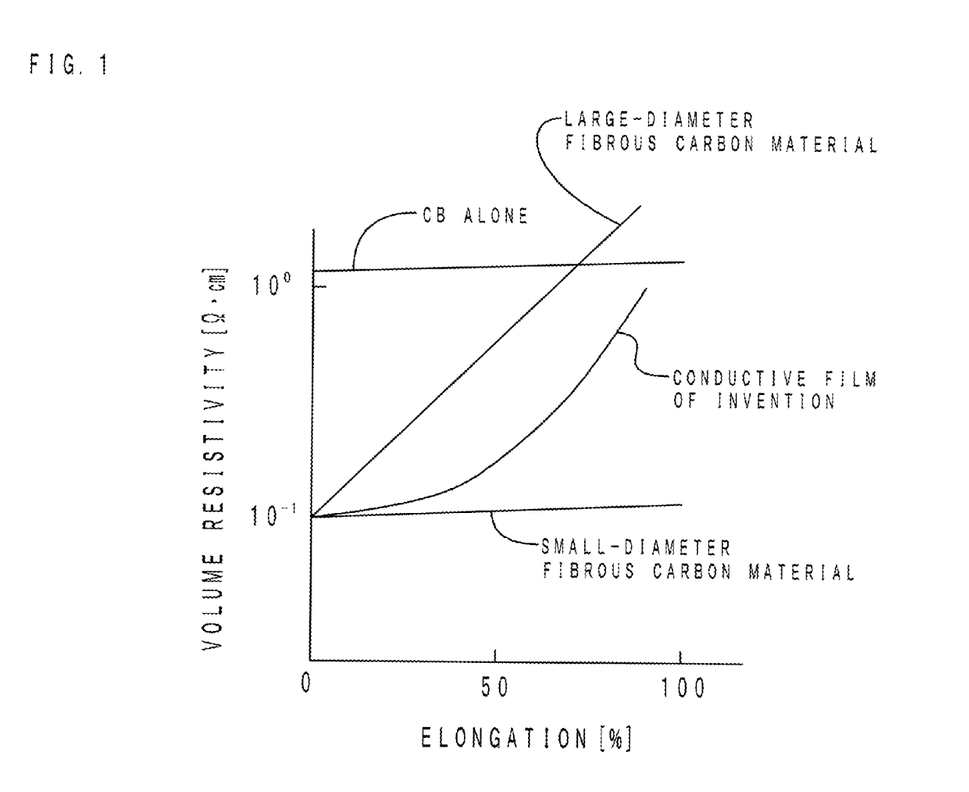
FIG. 1 is a schematic diagram showing changes in volume resistivity of conductive materials with respect to elongation.

As described above, when a large-diameter fibrous carbon material is blended as a conductive material in an elastomer, it is difficult to ensure the conductivity during expansion because the number of contact points of the conductive material is small. In this respect, in the conductive composition of the present invention, a conductive carbon black having a structure is blended in addition to a relatively large-diameter fibrous carbon material having a fiber diameter of not less than 30 nm. Thus, when a conductive film is formed, the conductive carbon black fills the gaps of the fibrous carbon material. The bridging of the gaps of the fibrous carbon material by the conductive carbon black can suppress an increase in electric resistance during expansion. The effects of the present invention will be described below using a schematic diagram.

FIG. 1 schematically shows changes in volume resistivity of conductive materials with respect to elongation. As shown in FIG. 1, when a conductive carbon black alone (CB alone) is blended in the elastomer, a change in volume resistivity due to expansion is small but the initial volume resistivity is relatively large. That is, the conductivity is low in the conductive material in which the conductive carbon black alone is blended in the elastomer. When a large-diameter fibrous carbon material alone is blended in the elastomer, the volume resistivity in a natural state (before expansion) is smaller compared to the case where conductive carbon black is blended. However, the volume resistivity sharply increases with the expansion. By contrast, the conductive film formed from the conductive composition according to the present invention exhibits a high conductivity in a natural state because of the large-diameter fibrous carbon material, and an increase in volume resistivity is moderated during expansion by the bridging effect of the conductive carbon black. For comparison, when a small-diameter fibrous carbon material alone is blended in the elastomer, the volume resistivity in a natural state is small and the change in volume resistivity due to expansion is also small. However, it is difficult to make a coating with the small-diameter fibrous carbon material because its dispersion in a polymer solution increases the viscosity. For this reason, it is impossible to form a thin film-like conductive film by screen printing, for example.

In this respect, the conductive composition of the present invention includes a relatively large-diameter fibrous carbon material having a fiber diameter of not less than 30 nm. The relatively large-diameter fibrous carbon material can be easily dispersed into a polymer solution using a triple-roll mill, for example. In addition, the viscosity increase is small. The dispersion using a triple-roll mill does not exert excessive shear force or shock on the conductive carbon black, so that the structure is less likely to be broken, and reduction in crystallinity is also suppressed. As described above, the conductive composition of the present invention can facilitate forming of a coating, and can achieve a conductive film having an excellent conductivity.

Examples of the method of applying the coating include printing processes such as screen printing, inkjet printing, flexographic printing, gravure printing, pad printing, metal mask printing, and lithography, and further include a dipping process, a spray process, and a bar coating process. The conductive composition of the present invention formed into a coating has a relatively small viscosity. Therefore, it is suitable for printing processes. Printing processes can easily form a thin film or a large-area conductive film. Also, with the printing processes, separation between a section to be coated and a section not to be coated is easy. Thus, even a conductive film in the form of a thin line or a complicated shape can be formed easily.

(2) A conductive film according to the present invention is formed from the conductive composition of the present invention. That is, the conductive film of the present invention contains an elastomer, a fibrous carbon material having a graphite structure with a fiber diameter of not less than 30 nm, and a conductive carbon black having a structure. As described above, in the conductive film of the present invention, the conductive carbon black bridges the gaps of the fibrous carbon material. The conductive film of the present invention therefore has a high conductivity, and the electric resistance is less likely to increase even during expansion.

(3) An electromagnetic shield according to the present invention is formed of the conductive film of the present invention having the constitution described in (2) above.

The electromagnetic shield of the present invention is flexible and has a high conductivity, and the electric resistance is less likely to increase even during expansion. Even for the use in an expandable/contractible member, the shield performance is less likely to be reduced. The electromagnetic shield of the present invention therefore has good durability.

(4) A transducer according to the present invention includes a dielectric layer made of a polymer, a plurality of electrodes arranged with the dielectric layer interposed therebetween, and a wire connected to each of the electrodes. Either or both of the electrodes and the wire are formed of the conductive film of the present invention having the constitution described in (2) above.

A transducer is a device that converts one form of energy into another form of energy. Transducers include actuators, sensors, power generation elements, and the like for performing conversion between mechanical energy and electrical energy, and speakers, microphones, and the like for performing conversion between acoustic energy and electrical energy. The electrodes and wires formed of the conductive film of the present invention are flexible and have a high conductivity, and the electric resistance is less likely to increase even during expansion. In the transducer of the present invention, therefore, the motion of the dielectric layer is less likely to be restricted by the electrodes and the wires. The electric resistance is less likely to increase over repeated expansion and contraction. In the transducer of the present invention, therefore, degradation in performance due to the electrodes and the wires is less likely to occur. The transducer of the present invention therefore has good durability.

(5) A flexible wiring board according to the present invention includes a substrate and a wire arranged on a surface of the substrate. At least part of the wire is formed of the conductive film of the present invention having the constitution described in (2) above.

The wire formed of the conductive film of the present invention is flexible and has a high conductivity, and the electric resistance is less likely to increase even during expansion. Thus, the performance of the flexible wiring board of the present invention is less likely to be degraded even when the substrate expands and contracts. The flexible wiring board of the present invention therefore has good durability.

DESCRIPTION OF THE REFERENCE NUMERALS

1: actuator (transducer), 10: dielectric layer, 11$a$, 11$b$: electrode, 12$a$, 12$b$: wire, 13: power source.

5: flexible wiring board, 50: substrate, 51: front wire connector, 52: back wire connector, 01X to 16$x$: front electrode, 01Y to 16Y: back electrode, 01X to 16$x$: front wire, 01$y$ to 16$y$: back wire.

MODES FOR CARRYING OUT THE INVENTION

Conductive Composition

The conductive composition of the present invention includes an elastomer component, a fibrous carbon material having a graphite structure and a fiber diameter of not less than 30 nm, and a conductive carbon black having a structure. In this description, the elastomer includes cross-linked rubbers and thermoplastic elastomers. Examples of the elastomer component included in the conductive composition of the present invention therefore include rubber polymers before cross-linkage and thermoplastic elastomers.

The elastomer preferably has a glass transition temperature (Tg) being room temperatures or lower, in view of having rubber-like elasticity at room temperatures. When Tg is lower, the crystallinity decreases. The elastomer becomes more expandable and contractible accordingly. For example, an elastomer having Tg of not more than −20° C., more preferably not more than −35° C., is more flexible and thus suitable. As the elastomer, one kind thereof may be used singly, or a mixture of two or more kinds thereof may be used.

The elastomer is preferably a cross-linked rubber because the restorability is good when deformation is repeated. Another preferred example is a material, such as a thermoplastic elastomer, that has a microphase separation structure of a hard segment and a soft segment and forms a pseudo cross-link. Examples of a material having a cross-linkable functional group include urethane rubber, acrylic rubber, silicone rubber, butyl rubber, butadiene rubber, ethylene oxide-epichlorohydrin copolymer, nitrile rubber, chloroprene rubber, natural rubber, isoprene rubber, styrene-butadiene rubber, ethylene-propylene-diene copolymer (EPDM), silicone rubber, and polyester rubber. Among those, acrylic rubber has a low crystallinity and a weak intermolecular force and thus has a Tg lower than those of the other rubbers. Thus, it is flexible and well expandable, and is suitable for electrodes of actuators, sensors, and the like.

Examples of the fibrous carbon material include carbon fibers and carbon nanotubes. Among those, a material having a graphite structure and a fiber diameter of not less than 30 nm can be used. In particular, carbon nanotubes of which the intensity ratio (G/D ratio) of a peak (G band) appearing in the vicinity of 1580 cm$^{-1}$ to a peak (D band) appearing in the vicinity of 1330 cm$^{-1}$ of Raman spectrum is not less than 1.8 are preferred in view of high crystallinity and high conductivity. Examples of the carbon nanotubes include those with a bamboo-like structure, such as cup-stacked carbon nanotubes having a structure in which cup-shaped carbon networks open at the bottom are stacked. A large fiber diameter facilitates dispersion into a polymer solution. For this reason, a material having a fiber diameter of not less than 50 nm, more preferably not less than 80 nm, is preferred. With a larger fiber diameter, however, the number of fibrous carbon material per unit mass is reduced when a conductive film is formed. Conductive paths are thus less likely to be formed. The fiber diameter is therefore preferably not more than 1000 nm. As the fibrous carbon material, one kind thereof may be used singly, or a mixture of two or more kinds thereof may be used.

The conductive carbon black is present in the gaps of the dispersed fibrous carbon material and serves the function of coupling the fibrous carbon material with each other to keep the conductivity. If the gaps of the fibrous carbon material dispersed in a polymer solution are small, the viscosity is likely to increase. Since the conductive carbon black is present in the gaps of the fibrous carbon material, the conductive carbon black also serves the function of widening the gaps of the fibrous carbon material to restrain an increase in viscosity. For example, the primary particle diameter of the conductive carbon black is preferably not more than 50 nm. In addition, a material having a large structure is preferred.

The conductive composition of the present invention may contain an organic solvent and an additive such as a cross-linking agent, a cross-linking accelerator, a cross-linking aid, a dispersant, a plasticizer, a processing aid, an antioxidant, a softener, and a colorant. The cross-linking agent, cross-linking accelerator, cross-linking aid, and the like may be selected as appropriate depending on, for example, the kind of the elastomer.

The addition of a dispersant can suppress excessive aggregation of the conductive carbon black. Thus, a viscosity increase due to aggregation of the conductive carbon black and an increase in pseudoplasticity can be suppressed. A compound having a high affinity for the fibrous carbon material and the conductive carbon black may be used as the dispersant. Preferred examples thereof include: polymer compounds having a substituent such as an amino group and a carboxy group or a substituent having a π conjugated system such as a phenyl group, pyrene, and porphyrin derivatives; phosphates; amine salts; polyethers; polyesters; and polyurethanes. A polymer compound having a high affinity for the elastomer may be used. Examples thereof include polymers of acrylic esters, methacrylic acid esters, acrylamide, and the like. Examples of polymer compounds having a high affinity for all of the fibrous carbon material, the conductive carbon black, and the elastomer include polyurethanes, polyamines, copolymers thereof, and polyamides.

The addition of a plasticizer and a softener can improve workability of the elastomer and further improve flexibility. Any plasticizer that has good compatibility with the elastomer can be used. Examples of the plasticizer that can be used include organic acid derivatives such as known phthalate diesters, phosphoric acid derivatives such as tricresyl phosphate, adipic acid diesters, chlorinated paraffins, and polyether esters. Plant-based softeners and mineral softeners can be used as the softener. Examples of the plant-based softeners include stearic acid, lauric acid, ricinoleic acid, palmitic acid, cottonseed oil, soybean oil, castor oil, palm oil, pine tar oil, tall oil, and factice. Examples of the mineral softeners include paraffin-based, naphthene-based, and aroma-based oils.

The conductive composition of the present invention can be prepared, for example, by kneading a mixture of the elastomer component, the fibrous carbon material, the conductive carbon black, and an additive blended if necessary, with a pressure kneading machine such as a kneader or a Banbury mixer, a twin roll, or the like. Alternatively, the conductive composition can be prepared by adding the fibrous carbon material, the conductive carbon black, and an additive blended if necessary, to a polymer solution containing the elastomer component dissolved in an organic solvent, and mixing them, for example, with a triple-roll mill (conductive coating). In the latter, when the viscosity is measured with a B-type viscometer with an H7 rotor under the conditions of a temperature of 25° C. and a rotation speed of 20 rpm, with a solid content concentration of not less than 20% by mass, the viscosity of the conductive composition of the present invention is preferably not more than 200 Pa·s. Thus, a conductive film can be formed easily from the conductive composition of the present invention by a printing process.

Among the printing processes, screen printing or metal mask printing are preferred. With screen printing and metal mask printing, plate-making is inexpensive, and large-area conductive films in various shapes can be formed easily. For example, it is possible to form a conductive film having an area as large as 0.2 m$^2$ or more per printing pattern. In addition, the film thickness can be easily controlled, and therefore a conductive film as thick as 50 µm or more can be formed easily, for example. A thick conductive film has a smaller electric resistance, thereby improving the performance of devices.

<Conductive Film>

The conductive film of the present invention is formed from the conductive composition of the present invention. For example, the conductive film can be formed by press-forming the conductive composition prepared by kneading. Alternatively, the conductive film can be formed by applying the conductive composition prepared in a coating state (conductive coating) on a substrate and drying by heating. A variety of known methods can be employed as the method of application. In particular, screen printing is preferred as previously described.

The thickness of the conductive film of the present invention can be determined as appropriate depending on applications. For example, when the conductive film of the present invention is used as electrodes and/or wiring of actuators, sensors, or the like, the thickness may be set to not less than 1 µm and not more than 500 µm. In the conductive film of the present invention, the electric resistance is less likely to increase even during expansion. For example, in consideration of the use in a part subjected to repeated expansion and contraction, such as electrodes and wiring of flexible transducers, the volume resistivity is preferably not more than 0.5 Ω·cm when the conductive film of the present invention is expanded in a uniaxial direction by 50%.

The conductive film of the present invention is formed on a surface of various substrates including a dielectric layer. Examples of the substrates include bendable resin sheets of polyimide, polyethylene, polyethylene terephthalate (PET), polyethylene naphthalate (PEN) and other materials, and expandable and contractible elastomer sheets. Examples of the elastomer include acrylic rubber, EPDM, nitrile rubber, urethane rubber, butyl rubber, silicone rubber, chloroprene rubber, ethylene-vinyl acetate copolymer, and thermoplastic elastomers (olefinic, styrenic, polyester-based, acrylic, urethane-based, and polyvinyl chloride-based). When the conductive film of the present invention is formed on a surface of an expandable and contractible substrate, the flexibility is high, and the effect of being less likely to increase electric resistance during expansion is enhanced. For example, a substrate whose elongation at break measured in accordance with JIS K6251: 2010 is 5% or more is preferred.

If the adhesiveness of the conductive film on the substrate is insufficient, the conductive film may be separated from the substrate over repeated expansion and contraction. In addition, dielectric breakdown may be caused by, for example, voids generated between the conductive film and the substrate. The conductive film is therefore required to be bonded to the substrate reliably. For example, a polymer having a cross-linkable functional group is used as the elastomer component in the conductive composition for forming the conductive film, and a polymer having a functional group is used as the substrate. The functional group of the substrate is allowed to react during cross-linking of the elastomer component, so that the conductive film and the substrate can be bonded through chemical bonding. Thus, the adhesiveness of the conductive film with the substrate can be improved. For example, a functional group can be provided by performing surface treatment on the substrate. The surface treatment is performed by corona discharge, irradiation of plasma, laser, ultraviolet rays, etc, primer coating, or other means.

<Electromagnetic Shield>

The electromagnetic shield according to the present invention is formed of the conductive film of the present invention. The electromagnetic shield serves the functions of blocking leakage of electromagnetic waves generated in electronic equipment to the outside and intrusion of external electromagnetic waves to the inside. For example, to provide the electromagnetic shield on the inner surface of the casing of electronic equipment, the conductive composition of the present invention prepared in a liquid state may be applied on the inner surface of the casing of electronic equipment and dried.

<Transducer>

The transducer of the present invention includes a dielectric layer made of a polymer, a plurality of electrodes arranged with the dielectric layer interposed therebetween, and a wire connected to each of the electrodes. The transducer of the present invention may have a stack structure in which the dielectric layer and the electrode are alternately stacked.

The dielectric layer is formed of a polymer, that is, a resin or an elastomer. Elastomers are preferred because they are expandable and contractible. In particular, an elastomer having a high dielectric constant is desirable in terms of increasing the amount of displacement and the force produced. Specifically, preferred is an elastomer having a dielectric constant (100 Hz) of 2 or more at room temperatures, more preferably 5 or more. Examples of the elastomer that may be used include elastomers having a polar functional group such as an ester group, a carboxyl group, a hydroxy group, a halogen group, an amide group, a sulfone group, a urethane group, and a nitrile group, or elastomers to which a polar low-molecular-weight compound having these polar functional groups. Examples of preferable elastomers include silicone rubber, acrylonitrile-butadiene rubber (NBR), hydrogenated acrylonitrile-butadiene rubber (H-NBR), EPDM, acrylic rubber, urethane rubber, epichlorohydrin rubber, chlorosulfonated polyethylene, and chlorinated polyethylene. The wording "made of a polymer" means that the base material of the dielectric layer is a resin or an elastomer. Thus, a component other than the elastomer or resin component, such as an additive, may be contained.

The thickness of the dielectric layer may be determined as appropriate depending on, for example, applications of the transducer. For example, in the case of an actuator, the thickness of the dielectric layer is desirably small in light of size reduction, low potential driving, larger displacement, and the like. In this case, also in consideration of a dielectric breakdown property and the like, the thickness of the dielectric layer is desirably not less than 1 µm and not more than 1000 µm (1 mm). The thickness of not less than 5 µm and not more than 200 µm is more preferred.

Either or both of the electrodes and the wire are formed of the conductive film of the present invention. The configuration and production process of the conductive film of the present invention are as described above. A description thereof is omitted here. Preferred modes of the conductive film of the present invention are also applied to the electrodes and wires of the transducer of the present invention. An embodiment of an actuator will be described below as an example of the transducer of the present invention.

Figure 3:
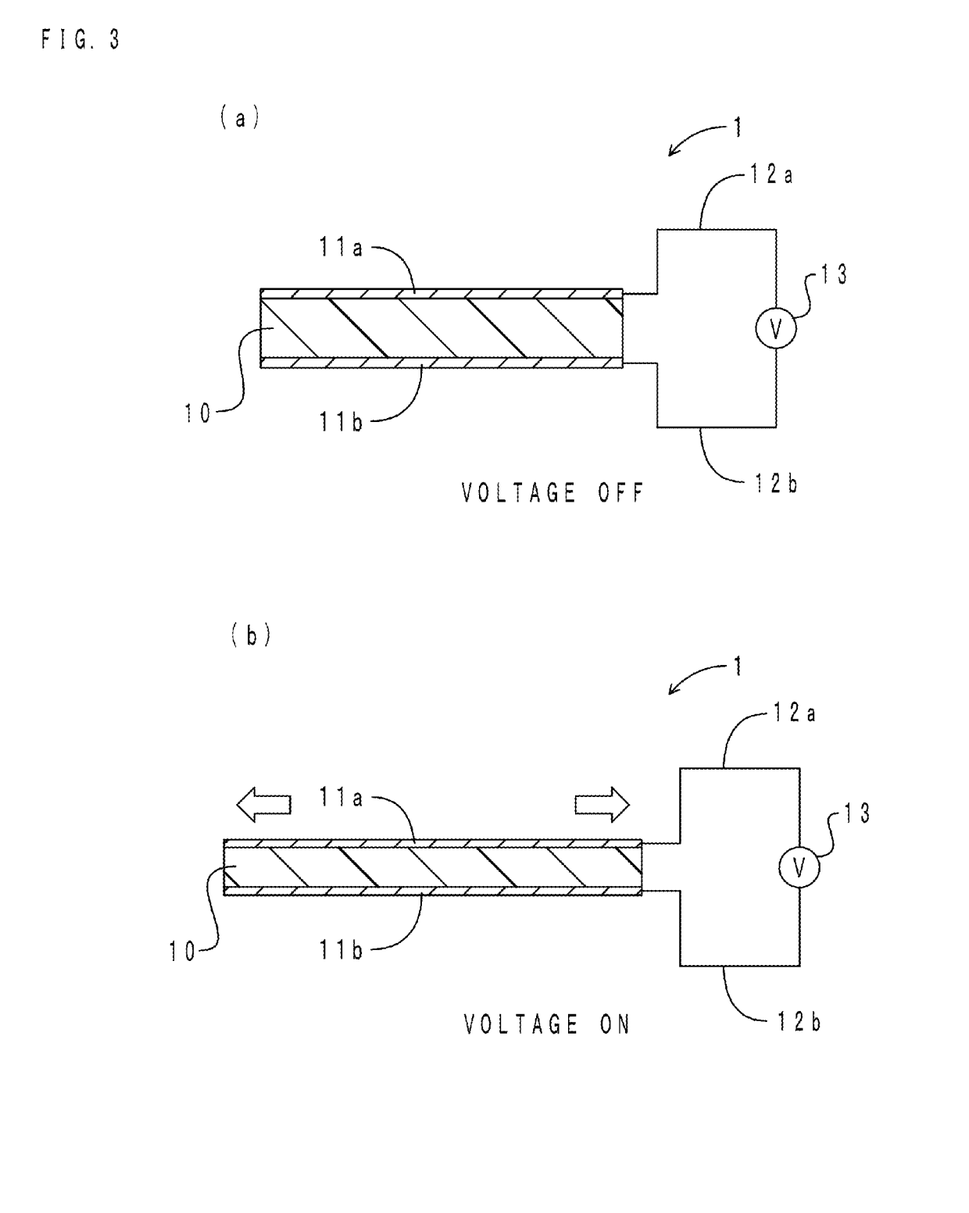
FIG. 3 is a schematic sectional view of an actuator as an embodiment of a transducer of the present invention, in which (a) shows a voltage-off state and (b) shows a voltage-on state.

FIG. 3 is a schematic sectional view of the actuator of the present embodiment. The voltage-off state is shown in (a), and the voltage-on state is shown in (b).

As shown in FIG. 3, the actuator 1 includes a dielectric layer 10, electrodes 11a, 11b, and wires 12a, 12b. The dielectric layer 10 is made of silicone rubber. The electrode 11a is arranged so as to cover almost the entire top surface of the dielectric layer 10. Similarly, the electrode 11b is arranged so as to cover almost the entire bottom surface of the dielectric layer 10. The electrodes 11a and 11b are connected to a power source 13 through the wires 12a and 12b, respectively. The electrodes 11a and 11b are formed of a conductive film formed by screen-printing the conductive composition of the present invention.

To switch the off state to the on state, voltage is applied between a pair of electrodes 11a and 11b. With the application of voltage, the thickness of the dielectric layer 10 decreases, and the dielectric layer 10 expands accordingly parallel to the plane of the electrodes 11a and 11b, as shown by white arrows in FIG. 3(b). The actuator 1 thereby outputs a drive force in the up/down direction and the left-right direction in the figure.

According to the present embodiment, the electrodes 11a and 11b are flexible and have expandability and contractibility. For this reason, the electrodes 11a and 11b are less likely to restrict the motion of the dielectric layer 10. A large force and amount of displacement therefore can be obtained with the actuator 1. The electrodes 11a and 11b have a high conductivity. In addition, the electric resistance is less likely to increase over repeated expansion and contraction. For this reason, degradation in performance due to the electrodes 11a and 11b is less likely to occur in the actuator 1. The actuator 1 therefore has good durability.

<Flexible Wiring Board>

The flexible wiring board of the present invention includes a substrate and a wire arranged on a surface of the substrate. The material of the substrate is not particularly limited. Examples thereof include bendable resin sheets and expandable and contractible elastomer sheets listed above as preferred examples of the substrate on which the conductive film of the present invention is formed.

At least part of the wire is formed of the conductive film of the present invention. The configuration and production process of the conductive film of the present invention are as described above. A description thereof is omitted here. Preferred modes of the conductive film of the present invention are also applied to the flexible wiring board of the present invention. An embodiment of the flexible wiring board of the present invention will be described below.

Figure 4:
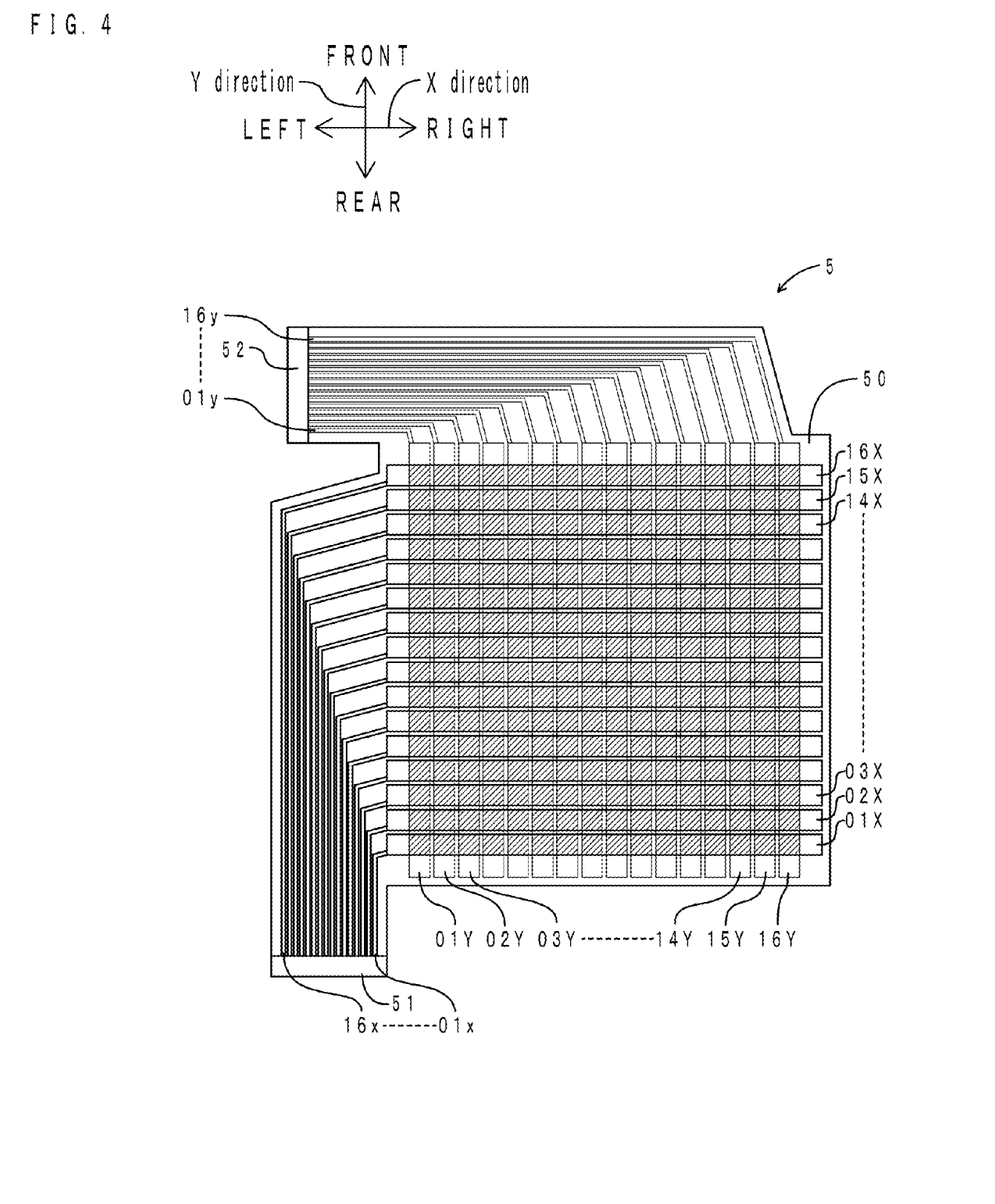
FIG. 4 is a top perspective view of a flexible wiring board of the present invention.

First, the configuration of the flexible wiring board of the present embodiment is described. FIG. 4 is a top perspective view of the flexible wiring board of the present embodiment. In FIG. 4, the electrodes and wires on the back side are shown by thin lines. As shown in FIG. 4, a flexible wiring board 5 includes a substrate 50, front electrodes 01X to 16X, back electrodes 01Y to 16Y, front wires $01x$ to $16x$, back wires $01y$ to $16y$, a front wire connector 51, and a back wire connector 52.

The substrate 50 is made of urethane rubber and shaped like a sheet. A total of 16 front electrodes 01X to 16X are arranged on the top surface of the substrate 50. The front electrodes 01X to 16X are each shaped like a strip. The front electrodes 01X to 16X each extend in the X direction (the left-right direction). The front electrodes 01X to 16X are arranged so as to be spaced apart at particular intervals in the Y direction (the front-rear direction) and approximately parallel to each other. Similarly, a total of 16 back electrodes 01Y to 16Y are arranged on the bottom surface of the substrate 50. The back electrodes 01Y to 16Y are each shaped like a strip. The back electrodes 01Y to 16Y each extend in the Y direction. The back electrodes 01Y to 16Y are arranged so as to be spaced apart at particular intervals in the X direction and approximately parallel to each other. As shown by the hatching in FIG. 4, the intersections (overlapping portions) of the front electrodes 01X to 16X and the back electrodes 01Y to 16Y, with the substrate 50 interposed therebetween, form a detector for detecting a load or the like.

A total of 16 front wires $01x$ to $16x$ are arranged on the top surface of the substrate 50. The front wires $01x$ to $16x$ are each shaped like a line. The front wires 01X to $16x$ are formed of a conductive film formed by screen-printing the conductive composition of the present invention. The front wire connector 51 is arranged on the rear-left corner of the substrate 50. The front wires $01x$ to $16x$ connect the left ends of the front electrodes 01X to 16X, respectively, to the front wire connector 51. The top surface of the substrate 50, the front electrodes 01X to 16X, and the front wires 01X to $16x$ are covered with a front cover film (not shown) from above.

A total of 16 back wires $01y$ to $16y$ are arranged on the bottom surface of the substrate 50. The back wires $01y$ to $16y$ are each shaped like a line. The back wires $01y$ to $16y$ are formed of a conductive film formed by screen-printing the conductive composition of the present invention. The back wire connector 52 is arranged on the front-left corner of the substrate 50. The back wires $01y$ to $16y$ connect the front ends of the back electrodes 01Y to 16Y, respectively, to the back electrode connector 52. The bottom surface of the substrate 50, the back electrodes 01Y to 16Y, and the back wires $01y$ to $16y$ are covered with a back cover film (not shown) from below.

The front wire connector 51 and the back wire connector 52 are each electrically connected with an operation unit (not shown). The operation unit receives impedance at the detector from the front wires 01X to $16x$ and the back wires $01y$ to $16y$. Based on this, a surface pressure distribution is measured.

The operation effects of the flexible wiring board 5 of the present embodiment will now be described. According to the present embodiment, the front wires $01x$ to $16x$ and the back wires $01y$ to $16y$ are each flexible and have expandability and contractibility, and thus, can be deformed in accordance with deformation of the substrate 50. The front wires $01x$ to $16x$ and the back wires $01y$ to $16y$ each have a high conductivity, and the electric resistance is less likely to increase even during expansion. The performance of the flexible wiring board 5 is therefore less likely to be degraded even when the substrate 50 expands and contracts. The flexible wiring board 5 therefore has good durability. As described above, the flexible wiring board 5 is suitable for connecting an expandable/contractible element to an electrical circuit.

EXAMPLES

The present invention will be described more specifically with examples.

<Preparation of Conductive Composition and Production of Conductive Film>

Example 1

First, 100 parts by mass of acrylic rubber polymer ("Nipol (registered trademark) AR42" manufactured by ZEON CORPORATION) and 0.25 parts by mass of isophoronediamine as a cross-linking agent were mixed with a roll kneader to prepare a mixture. The mixture was then dissolved in ethylene glycol monobutyl ether acetate as a solvent to prepare a polymer solution. Subsequently, 35 parts by mass of carbon nanotubes ("VGCF (registered trademark)" manufactured by SHOWA DENKO K.K., fiber diameter 150 nm, length 10 μm, G/D ratio=5), 18 parts by mass of a conductive carbon black ("KetjenBlack EC300J" manufactured by Ketjen Black International Company), and 20 parts by mass of a high-molecular compound having an amino group ("BYK-185" manufactured by BYK Japan KK) as a dispersant were added to the prepared polymer solution, and kneaded with a triple-roll mill to prepare a conductive composition (hereinafter called "conductive coating" as appropriate).

The viscosity of the conductive coating was measured with a B-type viscometer with an H7 rotor under the conditions of a temperature of 25° C. and a rotation speed of 20 rpm. The resulting viscosity of the conductive coating was 175 Pa·s. The mass of a nonvolatile component in the subsequent drying of the applied film was measured to calculate the solid content concentration of the conductive coating. The resulting solid content concentration of the conductive coating was 25% by mass.

The conductive coating was applied on a surface of a PET substrate by a bar coating process. The coating was thereafter dried by heating at 150° C. for one hour, while a cross-linking reaction proceeded. A conductive film of 30 µm in thickness was thus produced.

Figure 2:
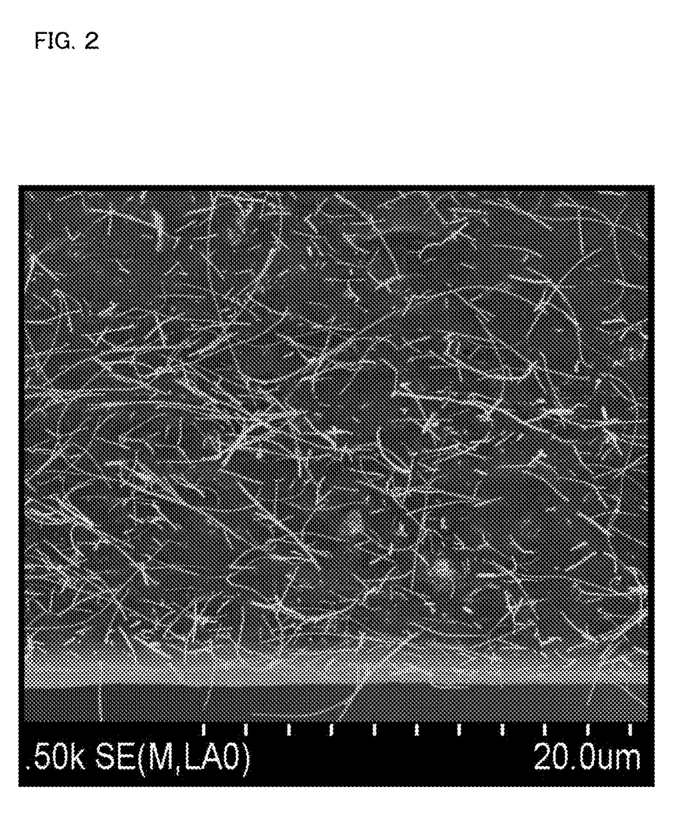
FIG. 2 is an SEM image of a frozen fracture face of a conductive film of Example 1.

The freeze fracture face of the produced conductive film was observed with a scanning electron microscope (SEM). FIG. 2 is an SEM image of the freeze fracture face of the conductive film of Example 1. As shown in FIG. 2, the fibrous carbon nanotubes are dispersed in the conductive film. The conductive carbon black in a structure state is contained so as to fill the gaps of the dispersed carbon nanotubes.

Example 2

A conductive coating was prepared with the kind of carbon nanotubes changed. Specifically, 15 parts by mass of carbon nanotubes ("VGCF-S" manufactured by SHOWA DENKO K.K., fiber diameter 80 nm, length 8 µm, G/D ratio=5), 11 parts by mass of the conductive carbon black (described above), and 20 parts by mass of the dispersant (described above) were added to the polymer solution prepared in Example 1, and kneaded with a triple-roll mill to prepare a conductive coating. A conductive film was then produced in the same manner as in Example 1. The solid content concentration of the conductive coating was calculated, and the viscosity of the conductive coating was measured in the same manner as in Example 1. The solid content concentration was 22% by mass, and the viscosity was 168 Pa·s.

Example 3

A conductive coating was prepared with the kind of elastomer changed. First, 100 parts by mass of silicon rubber polymer ("X40-3291-1" manufactured by Shin-Etsu Chemical Co., Ltd.) was dissolved in xylene as a solvent to prepare a polymer solution. Next, 20 parts by mass of the same carbon nanotubes as in Example 1, 11 parts by mass of the conductive carbon black (describe above), and 10 parts by mass of the dispersant (described above) were added to the prepared polymer solution, and kneaded with a triple-roll mill to prepare a conducive coating. A conductive film was then produced in the same manner as in Example 1. The solid content concentration of the conductive coating was calculated, and the viscosity of the conductive coating was measured in the same manner as in Example 1. The solid content concentration was 28% by mass, and the viscosity was 88 Pa·s.

Example 4

A conductive coating was prepared with the kind of carbon nanotubes changed. Specifically, 15 parts by mass of cupstacked carbon nanotubes ("Carber (registered trademark) 24HHT" manufactured by GSI Creos Corporation, fiber diameter (outer diameter) 80 nm, length 5 µm, G/D ratio=5), 11 parts by mass of the conductive carbon black (described above), and 20 parts by mass of the dispersant (described above) were added to the polymer solution prepared in Example 1, and kneaded with a triple-roll mill to prepare a conductive coating. A conductive film was then produced in the same manner as in Example 1. The solid content concentration of the conductive coating was calculated, and the viscosity of the conductive coating was measured in the same manner as in Example 1. The solid content concentration was 20% by mass, and the viscosity was 190 Pa·s.

Example 5

A conductive coating was prepared with the kind of carbon nanotubes changed. Specifically, 15 parts by mass of carbon nanotubes ("MWNT-7" manufactured by Hodogaya Chemical Co., Ltd., fiber diameter 70 nm, length 10 µm, G/D ratio=5), 11 parts by mass of the conductive carbon black (described above), and 20 parts by mass of the dispersant (described above) were added to the polymer solution prepared in Example 1, and kneaded with a triple-roll mill to prepare a conductive coating. A conductive film was then produced in the same manner as in Example 1. The solid content concentration of the conductive coating was calculated, and the viscosity of the conductive coating was measured in the same manner as in Example 1. The solid content concentration was 20% by mass, and the viscosity was 157 Pa·s.

Comparative Example 1

A conductive coating was prepared with the kind of carbon nanotubes changed. Specifically, 25 parts by mass of carbon nanotubes ("VGCF-X" manufactured by SHOWA DENKO K.K., fiber diameter 15 nm, length 3 µm, G/D ratio=1), 10 parts by mass of the conductive carbon black (described above), and 20 parts by mass of the dispersant (described above) were added to the polymer solution prepared in Example 1, and kneaded with a triple-roll mill to prepare a conductive coating. A conductive film was then produced in the same manner as in Example 1. The solid content concentration of the conductive coating was calculated, and the viscosity of the conductive coating was measured in the same manner as in Example 1. The solid content concentration was 16% by mass, and the viscosity was 618 Pa·s.

Comparative Example 2

A conductive coating was prepared with the kind of carbon nanotubes changed. Specifically, 7 parts by mass of the same carbon nanotubes as in Example 1, 20 parts by mass of the same carbon nanotubes as in Comparative Example 1, 12 parts by mass of the conductive carbon black (described above), and 20 parts by mass of the dispersant (described above) were added to the polymer solution prepared in Example 1, and kneaded with a triple-roll mill to prepare a conductive coating. A conductive film was then produced in the same manner as in Example 1. The solid content concentration of the conductive coating was calculated, and the viscosity of the conductive coating was measured in the same manner as in Example 1. The solid content concentration was 16% by mass, and the viscosity was 441 Pa·s.

Table 1 shows the kinds and blended amounts of raw materials used, and the solid content concentrations and viscosities of the conductive coatings. In Table 1, the blended amount of raw material is a proportion by mass where the mass (solid content) of the conductive film is 100% by mass.

TABLE 1

| | | | Example 1 | Example 2 | Example 3 | Example 4 | Example 5 | Comparative Example 1 | Comparative Example 2 |
|---|---|---|---|---|---|---|---|---|---|
| Blended amount of raw materials (% by mass) | Elastomer | Acrylic rubber | 57.7 | 68.4 | — | 68.4 | 68.4 | 64.1 | 64.1 |
| | | Silicone rubber | — | — | 70.9 | — | — | — | — |
| | Fibrous carbon material | Carbon nanotubes (φ150 nm, G/D ratio = 5) | 20.2 | — | 14.2 | — | — | — | 4.2 |
| | | Carbon nanotubes (φ80 nm, G/D ratio = 5) | — | 10.3 | — | — | — | — | — |
| | | Cup-stacked carbon nanotubes (φ80 nm, G/D ratio = 5) | — | — | — | 10.3 | — | — | — |
| | | Carbon nanotubes (φ70 nm, G/D ratio = 5) | — | — | — | — | 10.3 | — | — |
| | | Carbon nanotubes (φ15 nm, G/D ratio = 1) | — | — | — | — | — | 14.2 | 10.0 |
| | Conductive carbon black | Ketjen black | 10.4 | 7.5 | 7.8 | 7.5 | 7.5 | 7.8 | 7.8 |
| | Dispersant | | 11.5 | 13.7 | 7.1 | 13.7 | 13.7 | 13.7 | 13.7 |
| | Cross-linking agent | Isophoronediamine | 0.1 | 0.2 | — | 0.2 | 0.2 | 0.2 | 0.2 |
| Solid content concentraiton of conductive coating [% by mass] | | | 25 | 22 | 28 | 20 | 20 | 16 | 16 |
| Viscosity of conductive coating [Pa · s] | | | 175 | 168 | 88 | 190 | 157 | 542 | 397 |
| Evaluation results | Volume resistivity in natural state [Ω · cm] | | 0.17 | 0.17 | 0.15 | 0.13 | 0.18 | 0.25 | 0.22 |
| | Volume resistivity during 50% expansion [Ω · cm] | | 0.23 | 0.25 | 0.25 | 0.23 | 0.30 | 0.27 | 0.26 |

<Evaluations of Conductive Compositions and Conductive Films>

The conductivity of the produced conductive films was evaluated as follows. First, the volume resistivity of the conductive film in a natural state (before expansion) was measured. The measurement of the volume resistivity was conducted in accordance with the parallel terminal electrode method of JIS K6271 (2008). In measurement of the volume resistivity, a commercially available rubber sheet ("VHB (registered trademark) 4910" manufactured by Sumitomo 3M Limited) was used as an insulating resin support for supporting the conductive film (test piece). The conductive film was then expanded in a uniaxial direction at an expansion ratio of 50%, and the volume resistivity was measured. The expansion ratio was calculated by the following equation (1).

$$\text{Expansion ratio}(\%) = (\Delta L_0/L_0) \times 100 \quad (1)$$

[$L_0$: distance between reference lines of the test piece, $\Delta L_0$: an increase due to expansion of the distance between reference lines of the test piece]

The measurement results of the volume resistivity are shown in Table 1 above. As shown in Table 1, it was confirmed that all the conductive films of Examples 1 to 5 had a high conductivity and an increase in volume resistivity was small even when expanded. Specifically, the volume resistivities of the conductive films of Example 1 to 5 expanded in a uniaxial direction by 50% were each 0.5 Ω·cm or less.

As for the conductive coatings of Examples 1 to 5, the viscosity was not more than 200 Pa·s although the solid content concentration was not less than 20% by mass. A conductive film can be formed easily by a printing process such as screen printing with the conductive coatings of Examples 1 to 5, because the viscosity of the conductive coatings is small. By contrast, as for the conductive coatings of Comparative Examples 1 and 2, in which small-diameter carbon nanotubes with a fiber diameter of less than 30 nm were blended, the viscosity greatly exceeded 200 Pa·s although the solid content concentration was less than 20% by mass. Therefore, screen printing cannot be used for forming a conductive film.

INDUSTRIAL APPLICABILITY

The conductive composition and the conductive film of the present invention are suitable for electrodes and wires of flexible actuators, sensors, etc., as well as electromagnetic shields, flexible wiring boards, etc. for use in wearable devices and the like. The use of the conductive film of the present invention in electrodes and wires can improve the durability of electronic equipment mounted on flexible parts such as movable units of robots, nursing care equipment, and interiors of transportation equipment.

The invention claimed is:

1. A conductive composition comprising:
   an elastomer component;
   a fibrous carbon material having a graphite structure and a fiber diameter of not less than 30 nm;
   an organic solvent; and
   a conductive carbon black having a structure, wherein
   the fibrous carbon material is carbon nanotubes of which an intensity ratio (G/D ratio) of a peak (G band) appearing in the vicinity of 1580 cm$^{-1}$ to a peak (D band) appearing in the vicinity of 1330 cm$^{-1}$ of Raman spectrum is not less than 1.8, and
   a viscosity measured with a B-type viscometer with an H7 rotor under conditions of a temperature of 25° C. and a rotation speed of 20 rpm is not more than 200 Pa·s, when a solid content concentration of the conductive composition is not less than 20% by mass.

2. The conductive composition according to claim 1, further comprising a dispersant.

3. The conductive composition according to claim 1 used in screen printing or metal mask printing.

4. A conductive film formed from the conductive composition according to claim 1.

5. The conductive film according to claim 4 formed by screen printing or metal mask printing.

6. The conductive film according to claim 4 formed on a surface of a substrate that is expandable and contractible, or bendable.

7. The conductive film according to claim 6, wherein
   the elastomer component in the conductive composition has a cross-linkable functional group;
   the substrate is made of a polymer having a functional group; and the conductive film is bonded to the substrate through chemical bonding between the cross-linkable functional group and the functional group.

8. The conductive film according to claim 4, wherein the volume resistivity is not more than 0.5 Ω·cm when the conductive film is expanded in a uniaxial direction by 50%.

9. An electromagnetic shield formed of the conductive film according to claim 4.

10. A transducer comprising:
a dielectric layer made of a polymer;
a plurality of electrodes arranged with the dielectric layer interposed therebetween; and
a wire connected to each of the electrodes, wherein either or both of the electrodes and the wire are formed of the conductive film according to claim 4.

11. A flexible wiring board comprising:
a substrate; and
a wire arranged on a surface of the substrate, wherein at least part of the wire is formed of the conductive film according to claim 4.

12. A conductive film formed from a conductive composition comprising:
an elastomer component;
a fibrous carbon material having a graphite structure and a fiber diameter of not less than 30 nm; and
a conductive carbon black having a structure, wherein
the fibrous carbon material is carbon nanotubes of which an intensity ratio (G/D ratio) of a peak (G band) appearing in the vicinity of 1580 $cm^{-1}$ to a peak (D band) appearing in the vicinity of 1330 $cm^{-1}$ of Raman spectrum is not less than 1.8; and
wherein the volume resistivity of the conductive film is not more than 0.5 Ω·cm when the conductive film is expanded in a uniaxial direction by 50%.

13. The conductive film according to claim 12, wherein the conductive composition further comprises a dispersant.

14. The conductive film according to claim 12 formed by screen printing or metal mask printing.

15. The conductive film according to claim 12 formed on a surface of a substrate that is expandable and contractible, or bendable.

16. The conductive film according to claim 15, wherein
the elastomer component in the conductive composition has a cross-linkable functional group;
the substrate is made of a polymer having a functional group; and
the conductive film is bonded to the substrate through chemical bonding between the cross-linkable functional group and the functional group.

17. An electromagnetic shield formed of the conductive film according to claim 12.

18. A transducer comprising:
a dielectric layer made of a polymer;
a plurality of electrodes arranged with the dielectric layer interposed therebetween; and
a wire connected to each of the electrodes, wherein either or both of the electrodes and the wire are formed of the conductive film according to claim 12.

19. A flexible wiring board comprising:
a substrate; and
a wire arranged on a surface of the substrate, wherein at least part of the wire is formed of the conductive film according to claim 12.

* * * * *